(12) United States Patent
Takada et al.

(10) Patent No.: US 12,554,192 B2
(45) Date of Patent: Feb. 17, 2026

(54) PELLICLE FILM, PELLICLE, CARBON NANOTUBE WEB AND PRODUCTION METHOD THEREFOR, CARBON NANOTUBE FILM, AND CARBON NANOTUBE THREAD AND PRODUCTION METHOD THEREFOR

(71) Applicant: TOPPAN INC., Tokyo (JP)

(72) Inventors: Naoya Takada, Tokyo (JP); Kazunori Seki, Tokyo (JP); Yutaka Kodera, Tokyo (JP)

(73) Assignee: TOPPAN INC., Tokyo (JP)

( * ) Notice: Subject to any disclaimer, the term of this patent is extended or adjusted under 35 U.S.C. 154(b) by 805 days.

(21) Appl. No.: 17/734,447

(22) Filed: May 2, 2022

(65) Prior Publication Data

US 2022/0260902 A1 Aug. 18, 2022

Related U.S. Application Data

(63) Continuation of application No. PCT/JP2020/039512, filed on Oct. 21, 2020.

(30) Foreign Application Priority Data

Nov. 5, 2019 (JP) ................................. 2019-200898

(51) Int. Cl.
G03F 1/64 (2012.01)
(52) U.S. Cl.
CPC ..................... *G03F 1/64* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | |
|---|---|---|
| 9,337,474 B1 | 5/2016 | Fischel |
| 2012/0205834 A1 | 8/2012 | Lemaire et al. |
| 2013/0295320 A1 | 11/2013 | Liu et al. |
| 2018/0329289 A1 | 11/2018 | Gallagher et al. |
| 2019/0129300 A1 | 5/2019 | Ono et al. |
| 2019/0308388 A1 | 10/2019 | Liu et al. |
| 2019/0382270 A1 | 12/2019 | Fujimoto et al. |

FOREIGN PATENT DOCUMENTS

| | | |
|---|---|---|
| JP | 2012-153540 A | 8/2012 |
| JP | 2012-213716 A | 11/2012 |
| JP | 2013-234116 A | 11/2013 |
| JP | 2018-115083 A | 7/2018 |
| JP | 2018-194838 A | 12/2018 |
| JP | 2018-194840 A | 12/2018 |

(Continued)

OTHER PUBLICATIONS

Office Action issued in corresponding Japanese Patent Application No. 2019-200898 dated Oct. 24, 2023 (8 pages).

(Continued)

*Primary Examiner* — Daborah Chacko-Davis
(74) *Attorney, Agent, or Firm* — Foley & Lardner LLP

(57) ABSTRACT

A technique that can achieve a pellicle film made of carbon nanotubes and having high in-plane transmittance uniformity. The pellicle film contains a plurality of first carbon nanotubes extending in a first direction and arrayed in the radial direction, and a plurality of second carbon nanotubes extending in a second direction intersecting the first direction, and arrayed in their radial direction.

16 Claims, 7 Drawing Sheets

(56) References Cited

FOREIGN PATENT DOCUMENTS

| JP | 2019-049077 A | 3/2019 |
| WO | WO 2009/054422 A1 | 4/2009 |
| WO | WO 2018/008594 A1 | 1/2018 |

OTHER PUBLICATIONS

International Searching Authority, "International Search Report," issued in connection with International Patent Application No. PCT/JP2020/039512, dated Dec. 15, 2020, 6 pages.

International Searching Authority, "Written Opinion," issued in connection with International Patent Application No. PCT/JP2020/039512, dated Dec. 15, 2020, 4 pages.

ANONYMOUS: "Research Disclosure", Research Disclosure, Kenneth Mason Publications, Hampshire, UK, GB, vol. 667, No. 1, Nov. 1, 2019, p. 1103.

Marina Y. Timmermans et al: "Free-standing carbon nanotube films for extreme ultraviolet pellicle application", Journal of Micro/Nanolithography, MEMS, and MOEMS, vol. 17, No. 04, Nov. 27, 2018.

Mei Zhang et al: "Strong, Transparent, Multifunctional, Carbon Nanotube Sheets", Science, American Association for the Advancement of Science, US, vol. 309, Aug. 19, 2005, pp. 1215-1219.

Partial Supplementary European Search Report issued in connection with EP Appl. Ser. No. 20885747.4 dated Dec. 6, 2022 (16 pages).

Office Action issued in corresponding Korean Patent Application No. 10-2022-7014510 dated Apr. 24, 2025.

PELLICLE FILM, PELLICLE, CARBON NANOTUBE WEB AND PRODUCTION METHOD THEREFOR, CARBON NANOTUBE FILM, AND CARBON NANOTUBE THREAD AND PRODUCTION METHOD THEREFOR

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/039512, filed on Oct. 21, 2020, which in turn claims the benefit of JP 2019-200898, filed Nov. 5, 2019, the disclosures of which are incorporated herein by reference in its entirety.

TECHNICAL FIELD

The present invention relates to pellicles.

BACKGROUND

Patterns with a minimum dimension that can be formed using photolithography depend on the wavelength of the light used for exposure. This minimum dimension can be reduced using shorter wavelength light for exposure.

In the past, ArF excimer laser light having a wavelength of 193 nm has been used for exposure. In recent years, there has been an increasing demand for photolithography capable of forming finer patterns, in response to which, use of extreme ultraviolet (EUV light) having a wavelength of 13.5 nm is becoming a trend.

Pellicles are used for preventing dust and other materials from adhering to photomasks or reticles. Since EUV light is easily absorbed into various substances, pellicle films made of polysilicon, which has low absorptance of EUV light, are under development in extreme ultraviolet lithography (EUVL).

However, pellicle films made of polysilicon are inferior in heat resistance. In this regard, pellicle films made of carbon materials, such as graphene or carbon nanotubes, are receiving attention (see PTLs 1 to 3).

CITATION LIST

Patent Literatures

PTL 1: JP 2018-194838 A; PTL 2: JP 2018-194840 A; PTL 3: WO2018/008594.

SUMMARY OF THE INVENTION

Pellicle films containing carbon nanotubes may have insufficient in-plane transmittance uniformity due to the carbon nanotubes being non-uniformly distributed.

The present invention aims to provide a technique that can achieve a pellicle film made of carbon nanotubes and having high in-plane transmittance uniformity.

According to a first aspect of the present invention, there is provided a pellicle film containing a plurality of first carbon nanotubes each extending in a first direction and arrayed in a radial direction, and a plurality of second carbon nanotubes each extending in a second direction intersecting the first direction, and arrayed in a radial direction.

According to another aspect of the present invention, there is provided a pellicle film according to the first aspect, in which the plurality of first carbon nanotubes form a first carbon nanotube web, and the plurality of second carbon nanotubes form a second carbon nanotube web overlapped with the first carbon nanotube web.

According to still another aspect of the present invention, there is provided a pellicle film according to the above aspect, in which at least one of the first carbon nanotube web and the second carbon nanotube web is provided with a plurality of pores.

According to still another aspect of the present invention, there is provided a pellicle film according to the above aspect, further including one or more covering layers covering at least one of the first carbon nanotube web and the second carbon nanotube web, the at least one of the first carbon nanotube web and the second carbon nanotube web being provided with the plurality of pores.

According to still another aspect of the present invention, there is provided a pellicle film according to any of the above aspects, in which the plurality of pores have a maximum diameter of 100 nm or less.

According to still another aspect of the present invention, there is provided a pellicle film according to the first aspect, in which the plurality of first carbon nanotubes form a plurality of first carbon nanotube threads each being formed of a plurality of carbon nanotubes, the plurality of second carbon nanotubes form a plurality of second carbon nanotube threads each being formed of a plurality of carbon nanotubes, and the plurality of first carbon nanotube threads and the plurality of second carbon nanotube threads form a woven textile.

According a second aspect of the present invention, there is provided a pellicle film containing a plurality of first carbon nanotube threads each being formed of a plurality of first carbon nanotubes and extending in a first direction; and a plurality of second carbon nanotube threads each being formed of a plurality of second carbon nanotubes and extending in a second direction intersecting the first direction, in which the plurality of first carbon nanotube threads and the plurality of second carbon nanotube threads form a woven textile.

According to still another aspect of the present invention, there is provided a pellicle film according to any of the above aspects, in which a maximum distance among distances between adjacent carbon nanotube threads in the plurality of first carbon nanotube threads, and among distances between adjacent carbon nanotube threads in the plurality of second carbon nanotube threads is 100 nm or less.

According to still another aspect of the present invention, there is provided a pellicle film according to the any of the above aspects, in which one or more carbon nanotube threads, in the plurality of first carbon nanotube threads and the plurality of second carbon nanotube threads, each have a diameter varying along a length direction.

According to still another aspect of the present invention, there is provided a pellicle film according to any of the above aspects, in which the pellicle film has a thickness of 500 nm or less.

According to a third aspect of the present invention, there is provided a pellicle including the pellicle film according to any of the above aspects; and a frame supporting the pellicle film.

According to a fourth aspect of the present invention, there is provided a carbon nanotube web containing a plurality of carbon nanotubes each extending in one direction and arrayed in a radial direction, in which the carbon nanotube web is provided with a plurality of pores.

According a fifth aspect of the present invention, there is provided a carbon nanotube film including a first carbon nanotube web including a plurality of first carbon nanotubes each extending in a first direction and arrayed in a radial direction; and a second carbon nanotube web including a plurality of second carbon nanotubes each extending in a second direction intersecting the first direction, and arrayed in a radial direction, in which at least one of the first carbon nanotube web and the second carbon nanotube web is provided with a plurality of pores.

According a sixth aspect of the present invention, there is provided a carbon nanotube thread containing a plurality of carbon nanotubes, in which the carbon nanotube thread has a diameter varying along a length direction.

According a seventh aspect of the present invention, there is provided a method of producing a carbon nanotube web, including preparing a carbon nanotube array formed of a plurality of carbon nanotubes extending from a support surface, the carbon nanotube array including one or more pores or concavities; and drawing out the carbon nanotubes in a web shape from an end face of the carbon nanotube array.

According an eighth aspect of the present invention, there is provided a method of producing a carbon nanotube thread, including preparing a carbon nanotube array formed of a plurality of carbon nanotubes extending from a support surface, the carbon nanotube array including one or more pores or concavities; and drawing out the carbon nanotubes in a thread shape from an end face of the carbon nanotube array.

According to the present invention, there is provided a technique that can achieve a pellicle film made of carbon nanotubes and having high in-plane transmittance uniformity.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

Figure 1:
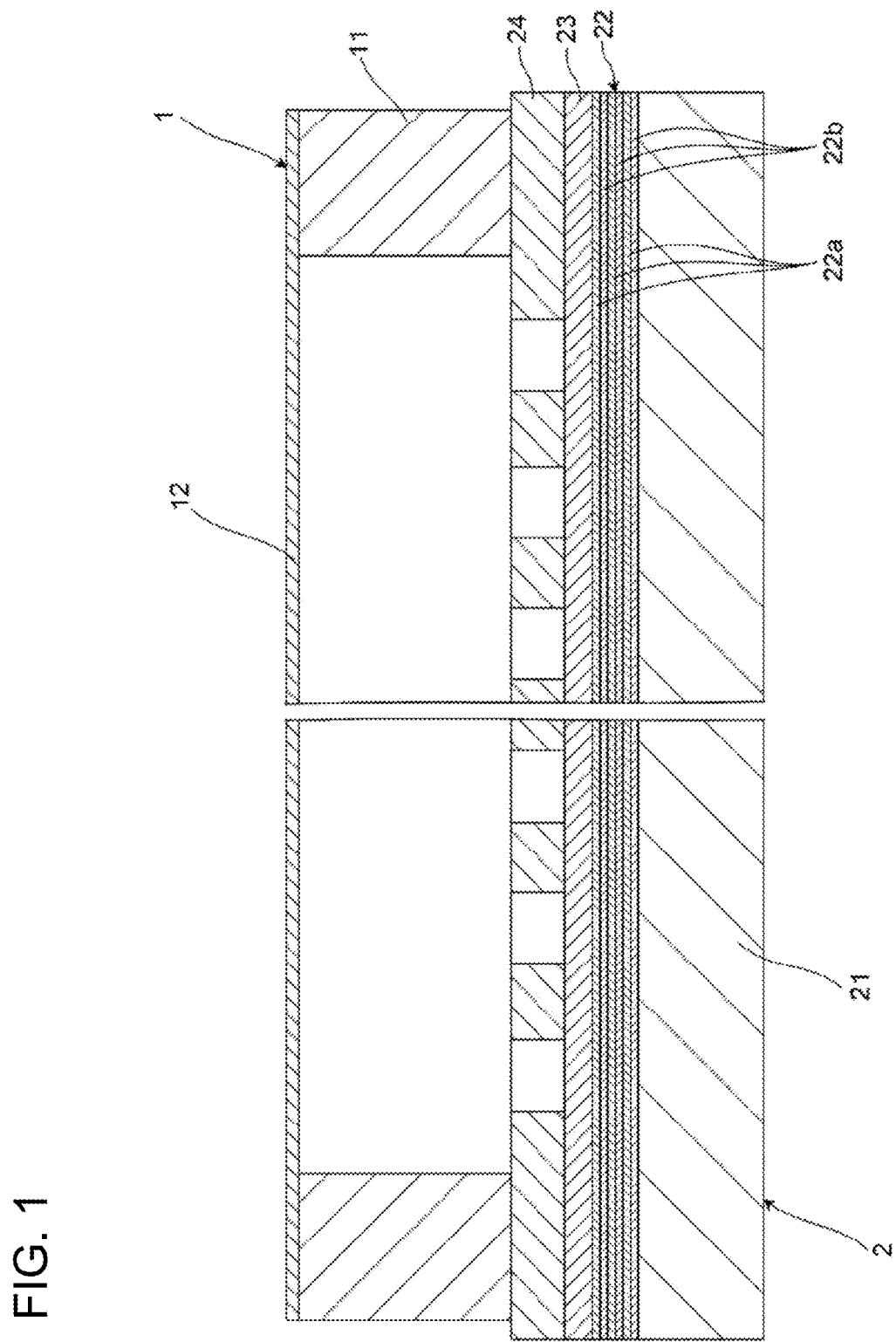
FIG. 1 is a schematic cross-sectional view illustrating a pellicle according to an embodiment of the present invention mounted on a photomask.

FIG. 1 is a schematic cross-sectional view illustrating a pellicle according to an embodiment of the present invention mounted on a photomask.

In FIG. 1, a photomask 2 on which a pellicle 1 is mounted is a reflective photomask used for EUV lithography. The pellicle 1 may be mounted on another type of photomask.

The photomask 2 includes a substrate 21, a multilayer reflective film 22, a capping film 23, and an absorption layer 24.

The substrate 21 has a flat front surface. The substrate 21 may be made of, for example, synthetic silica having low thermal expansion coefficient.

The multilayer reflective film 22 is provided on the front surface of the substrate 21. The multilayer reflective film 22 includes two or more layers having different refractive indices to EUV light. The multilayer reflective film 22 is designed to exhibit high reflectance to EUV light due to interference caused by repeated reflection, and low reflectance to other light.

Herein, the multilayer reflective film 22 includes alternately laminated reflective layers 22a and 22b having different refractive indices to EUV light. For example, of the reflective layers 22a and 22b, one may be made of silicon and the other may be made of molybdenum. It should be noted that, although the multilayer reflective film 22 includes three sets of the reflective layers 22a and 22b in FIG. 1, usually, it includes a higher number of sets, e.g., about 40 sets.

The capping film 23 is provided on the multilayer reflective film 22. The capping film 23 plays a role of protecting the multilayer reflective film 22 from etching agents or cleaning agents in the process of patterning performed for obtaining the absorption layer 24 or in the process of cleaning the photomask 2. For example, the capping film 23 may be made of ruthenium.

The absorption layer 24 is provided on the capping film 23. The absorption layer 24 is provided with openings corresponding to the exposure pattern for the photoresist layer on a semiconductor wafer.

The absorption layer 24 is a layer made of a material exhibiting high absorptance of EUV light. For example, the absorption layer 24 may be made of tantalum, indium oxide, tellurium oxide, or tin telluride.

The pellicle 1 is mounted on the photomask 2. The pellicle 1 herein prevents dust and other materials from adhering to the reflective surface of the photomask 2. It should be noted that, if the photomask is of a transmissive type, the pellicle 1 may be mounted on both surfaces of the photomask.

The pellicle 1 includes a frame 11 and a pellicle film 12.

The frame 11 is mounted on the photomask 2 via an adhesive, not shown. The frame 11 serves as a spacer for separating the pellicle film 12 from the photomask 2. For example, the frame 11 may be made of aluminum.

The pellicle film 12 is a film having high transmittance to exposure light which is EUV light herein. The pellicle film 12 is supported by the frame 11 so as to face the photomask 2 via the frame 11. Specifically, the pellicle film 12 has a periphery which is fixed to the frame 11 using an adhesive, for example.

The pellicle film 12 is a carbon nanotube film. Specifically, the pellicle film 12 contains a plurality of first carbon nanotubes extending in a first direction and arrayed in their radial direction, and a plurality of second carbon nanotubes extending in a second direction intersecting the first direction, and arrayed in their radial direction. According to an example, the pellicle film 12 may be made of only the first and second carbon nanotubes.

Figure 2:
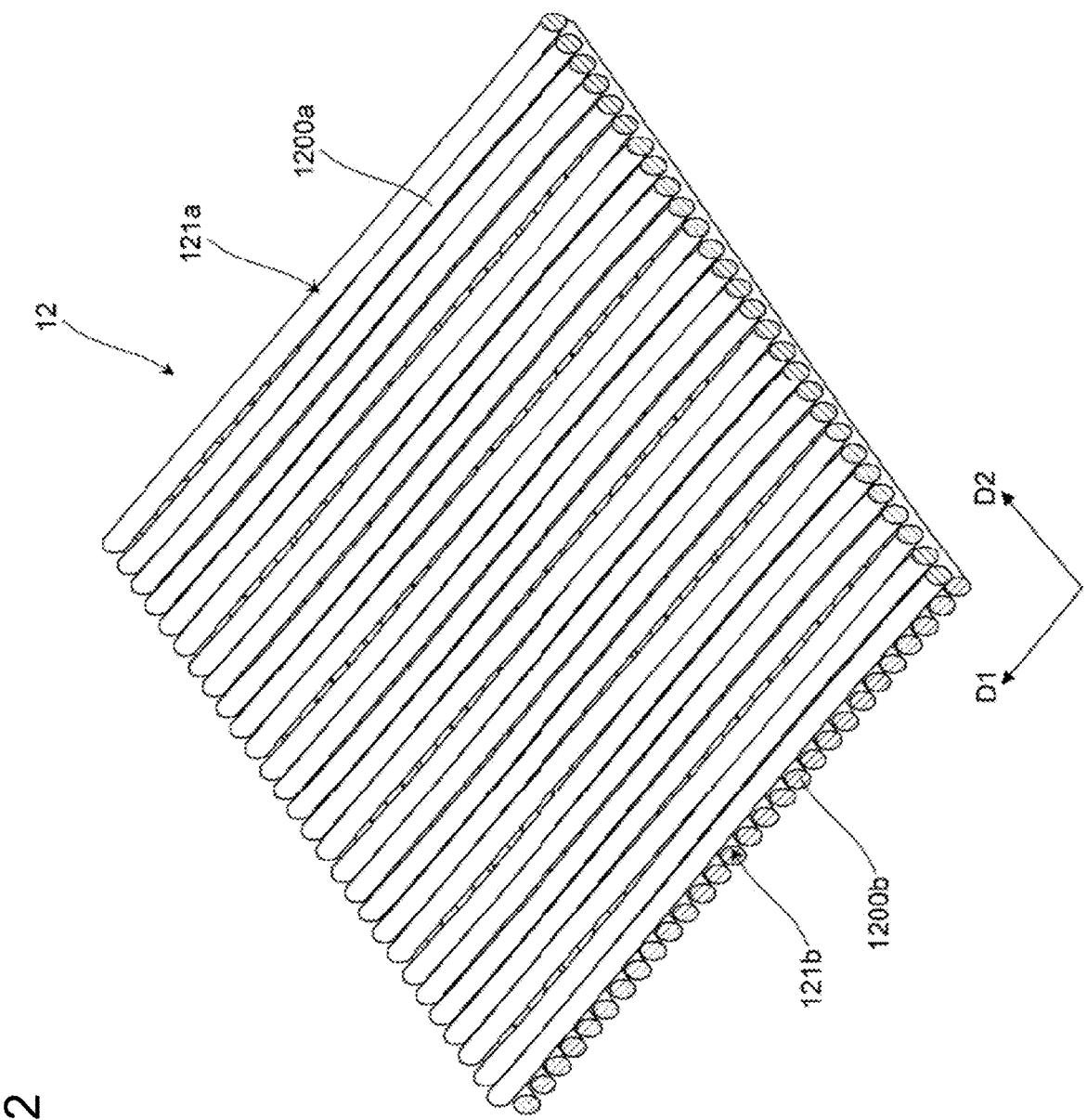
FIG. 2 is a schematic perspective view illustrating an example of a pellicle film that can be used for the pellicle shown in FIG. 1.

FIG. 2 is a schematic perspective view illustrating an example of a pellicle film that can be used for the pellicle shown in FIG. 1.

The pellicle film 12 shown in FIG. 2 includes a first carbon nanotube web 121a and a second carbon nanotube web 121b. The first and second carbon nanotube webs 121a and 121b overlap each other.

The first carbon nanotube web 121a is formed of a plurality of first carbon nanotubes 1200a. The first carbon nanotubes 1200a extend in a first direction D1 and are arrayed in their radial direction.

The second carbon nanotube web 121b is formed of a plurality of second carbon nanotubes 1200b. The second carbon nanotubes 1200b extend in a second direction D2 intersecting the first direction D1, and are arrayed in their radial direction. According to an example, the first and second directions D1 and D2 may be orthogonal to each other. The first and second directions D1 and D2 may obliquely intersect each other.

It should be noted that the first carbon nanotube web 121a could unavoidably contain carbon nanotubes extending in directions other than the first direction D1, or bent carbon nanotubes. Similarly, the second carbon nanotube web 121b could unavoidably contain carbon nanotubes extending in directions other than the second direction D2, or bent carbon nanotubes.

In FIG. 2, the first carbon nanotube web 121a is illustrated as if it is a monolayer film in which the first carbon nanotubes 1200a are arrayed only in the in-plane direction without being laminated in the thickness direction; however, the first carbon nanotubes 1200a may be laminated in the thickness direction, while being arrayed in the in-plane direction. Similarly, in FIG. 2, the second carbon nanotube web 121b is illustrated as if it is a monolayer film in which the second carbon nanotubes 1200b are arrayed only in the in-plane direction without being laminated in the thickness direction; however, the second carbon nanotubes 1200b may be laminated in the thickness direction, while being arrayed in the in-plane direction.

In FIG. 2, the carbon nanotubes have the same diameter in the first carbon nanotube web 121a, but they do not necessarily have to have the same diameter. Similarly, in FIG. 2, the carbon nanotubes have the same diameter in the second carbon nanotube web 121b, but they do not necessarily have to have the same diameter. Also, in FIG. 2, the carbon nanotubes have the same diameter between the first and second carbon nanotube webs 121a and 121b, but they do not necessarily have to have the same diameter between these webs.

Also, in FIG. 2, the first carbon nanotube web 121a is in contact with the second carbon nanotube web 121b, but these webs may be separated from each other. In other words, the first carbon nanotubes 1200a may be in contact with or separated from the second carbon nanotubes 1200b.

The pellicle film 12 may include three or more carbon nanotube webs. In this case, the pellicle film 12 may include two or more first carbon nanotube webs 121a and one or more second carbon nanotube webs 121b. Alternatively, the pellicle film 12 may include one or more first carbon nanotube webs 121a and two or more second carbon nanotube webs 121b. Alternatively, the pellicle film 12 may include one or more first carbon nanotube webs 121a, one or more second carbon nanotube webs 121b, and one or more carbon nanotube webs having a structure similar to the first and second carbon nanotube webs 121a and 121b except for having different length directions.

The pellicle film 12 is preferred to have a thickness of 500 nm or less. If the pellicle film 12 is thicker, transmittance for exposure light, which is EUV light herein, may be deteriorated. The thickness of the pellicle film 12 is preferred to be 10 nm or more. If the pellicle film 12 is thinner, physical strength thereof may be reduced, and dust and other materials may permeate into the pellicle film 12.

It is preferred that the pellicle film 12 does not allow permeation of dust and other materials with a diameter of more than 30 nm therethrough. In other words, the carbon nanotubes in the pellicle film 12 are preferred to have gaps therebetween which do not allow permeation of dust and other materials with a diameter of more than 30 nm therethrough.

For example, the pellicle film 12 can be prepared through the following method.

Figure 3:
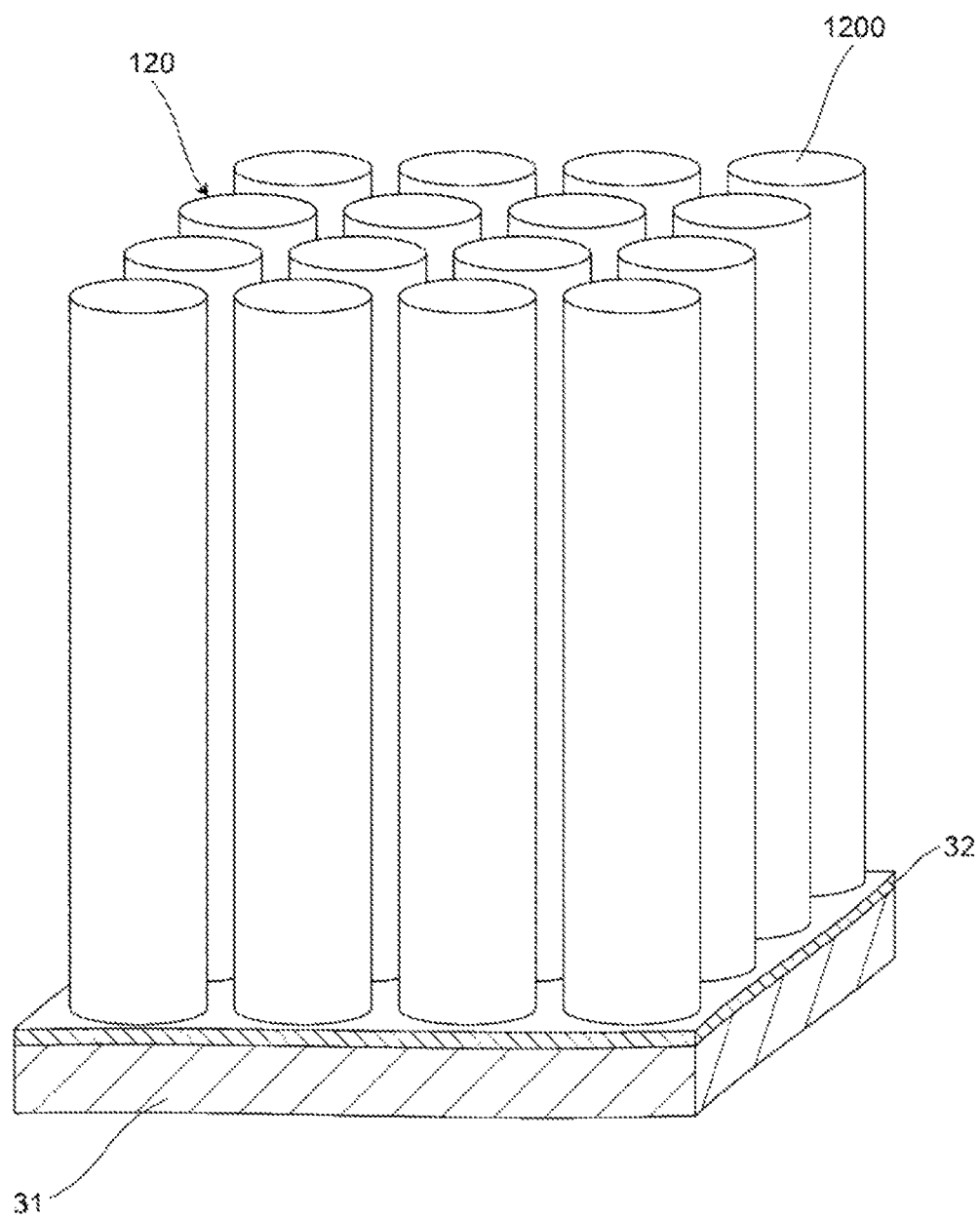
FIG. 3 is a schematic perspective view illustrating an example of a carbon nanotube array that can be used for preparing the pellicle film shown in FIG. 2.
Figure 4:
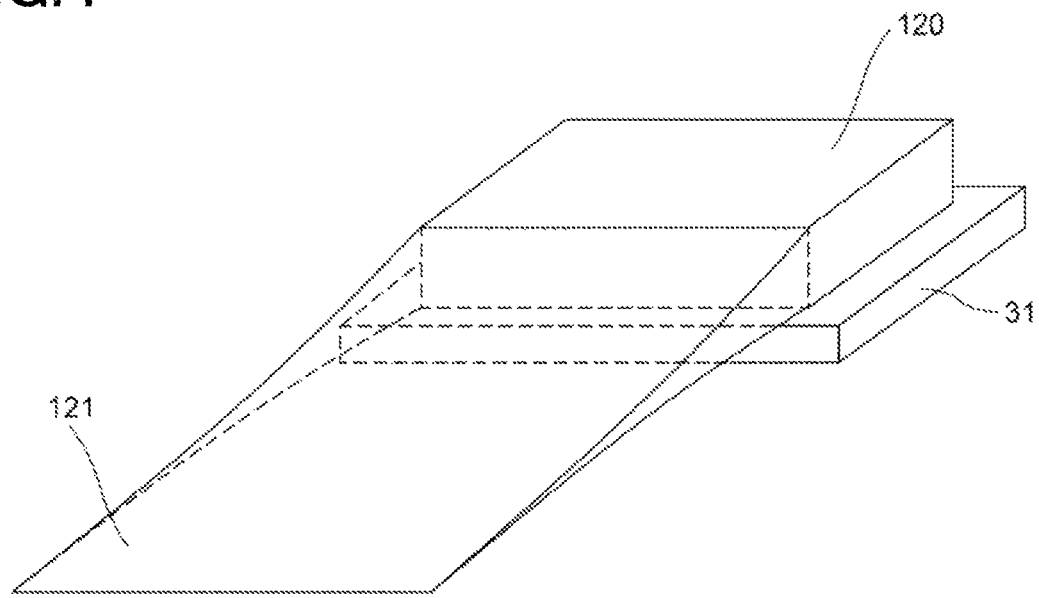
FIG. 4 is a schematic perspective view illustrating an example of a method of producing a carbon nanotube web.

FIG. 3 is a schematic perspective view illustrating an example of a carbon nanotube array that can be used for preparing the pellicle film shown in FIG. 2. FIG. 4 is a schematic perspective view illustrating an example of a method of producing a carbon nanotube web.

When preparing the pellicle film 12, the structure shown in FIG. 3 is prepared, first?? The structure shown in FIG. 3 includes a substrate 31, a catalyst layer 32, and a carbon nanotube array 120.

The substrate 31 has a flat front surface. For example, the substrate 31 may be a silicon substrate, glass substrate, or sapphire substrate.

The catalyst layer 32 is provided on the front surface of the substrate 31. For example, the catalyst layer 32 may be made of metal such as iron, nickel or cobalt.

There may be provided an underlayer between the substrate 31 and the catalyst layer 32. For example, the underlayer may be made of aluminum nitride, aluminum oxide, or silicon oxide.

The carbon nanotube array 120 is an aggregation of a number of carbon nanotubes 1200. The carbon nanotubes 1200 provided on the surface, as a support surface, of the catalyst layer 32 are substantially perpendicularly extended therefrom. It should be noted that the term carbon nanotube array is a synonym of the term carbon nanotube forest.

The carbon nanotubes 1200 may be single-wall nanotubes, or may be multiwall nanotubes, or may be a combination thereof. Furthermore, the carbon nanotubes 1200 may be any of armchair tubes, zigzag tubes, chiral tubes, or a combination of two or more of these tubes.

The carbon nanotubes 1200 may have a length, for example, in the range of 0.1 mm to 5 mm. It should be noted that the ratio between the length and the diameter of the carbon nanotubes 1200 shown in FIG. 3 is much smaller than the actual ratio.

The carbon nanotube array 120 can be prepared, for example, using chemical vapor deposition (CVD) such as super-growth CVD (water-assisted CVD).

Next, as shown in FIG. 4, the carbon nanotubes 1200 are drawn out in a web shape from an end face of the carbon nanotube array 120. The carbon nanotubes 1200 adjacent to each other in the radial direction experience the Van der Waals force. Therefore, for example, when the end face of the carbon nanotube array 120 or a part thereof is held and stretched in a direction away from the carbon nanotube array 120, the carbon nanotubes 1200 can be drawn out from the carbon nanotube array 120 one after another. Thus, a carbon nanotube web 121 can be obtained without using an adhesive or the like.

The carbon nanotube web 121 thus obtained is a self-supporting film that can be independently handled. Furthermore, most of the carbon nanotubes 1200 in the carbon nanotube web 121 have a shape extending in the direction in which they are drawn out.

Then, a plurality of carbon nanotube webs 121 are overlapped with each other so that the length direction of the carbon nanotubes 1200 contained in one web intersects the length direction of the carbon nanotubes 1200 contained in another web. Then, this laminate is pressed. The laminate may be pressed in its entirety, or only one or more portions thereof may be pressed. The laminate does not necessarily have to be pressed.

Through the process described above, a carbon nanotube film can be obtained. The carbon nanotube film thus obtained can be used as the pellicle film 12 described above.

The pellicle film 12 has high in-plane transmittance uniformity. This will be described below.

The carbon nanotube film can also be obtained, for example, by forming a coating film from a dispersion liquid of carbon nanotubes and removing the dispersion medium from the coating film. However, according to such a method, agglomeration of carbon nanotubes may occur in the process of removing the dispersion medium. Therefore, the carbon nanotube films obtained through this method tend to have portions where carbon nanotubes are present at high density and portions where they are present at low density.

Furthermore, most of the carbon nanotubes are curved and/or bent in carbon nanotube films obtained using a dispersion liquid of carbon nanotubes. Therefore, carbon nanotube films obtained through this method include a number of portions where the carbon nanotubes intersect each other. EUV light absorption occurs in the carbon nanotubes intersecting each other. Accordingly, as the number of intersections increases, a larger amount of EUV light is absorbed. Therefore, there may be a difference in the amount of absorbed EUV light between the portions where the carbon nanotubes intersect each other and the portions where they do not intersect each other. These intersections are not necessarily distributed uniformly, but may be distributed non-uniformly.

Accordingly, carbon nanotube films obtained using a dispersion liquid of carbon nanotubes have insufficient in-plane transmittance uniformity.

In contrast, most of the carbon nanotubes 1200 in the carbon nanotube web 121 have a shape extending in the direction in which they are drawn out. In other words, the carbon nanotubes 1200 extend in one direction and are arrayed in their radial direction.

Such a structure cannot be obtained using a dispersion liquid of carbon nanotubes, but can be obtained using the method described referring to FIG. 4. Therefore, the carbon nanotubes 1200 are uniformly distributed in the carbon nanotube web 121. Also, the carbon nanotube web 121 includes fewer portions where the carbon nanotubes 1200 intersect each other. Therefore, when a plurality of carbon nanotube webs 121 are overlapped with each other so that the length direction of the carbon nanotubes 1200 contained in one web intersects the length direction of the carbon nanotubes 1200 contained in another web, intersections of the carbon nanotubes 1200 can be uniformly distributed.

Accordingly, the pellicle film 12 has high in-plane transmittance uniformity.

The pellicle film 12 can be modified in various ways.

Figure 5:
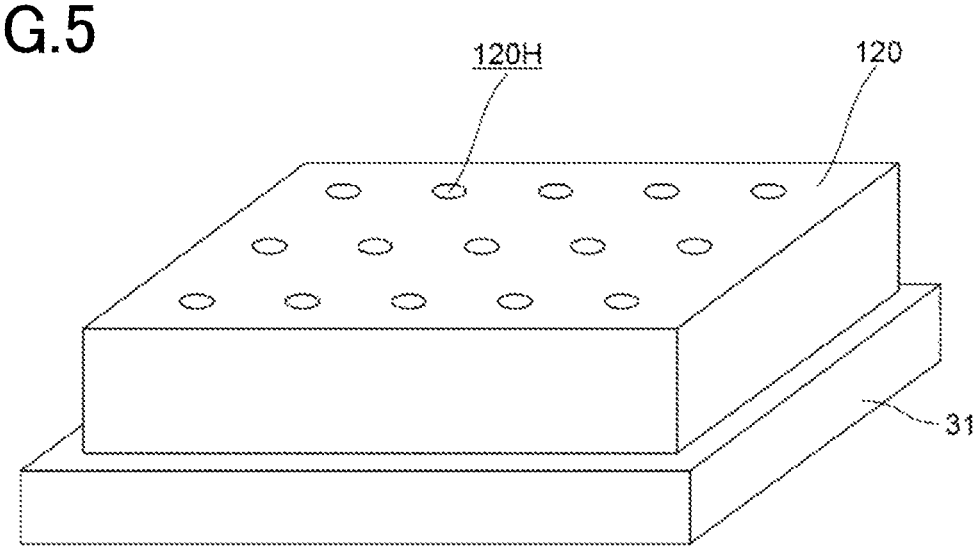
FIG. 5 is a schematic perspective view illustrating a modification of a carbon nanotube array.
Figure 6:
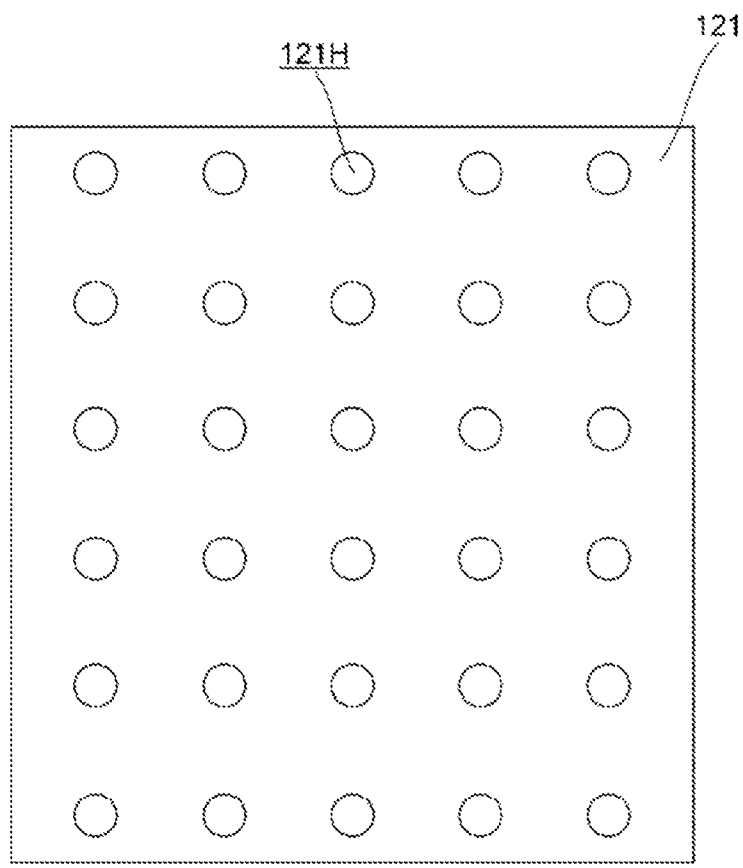
FIG. 6 is a schematic plan view illustrating an example of a carbon nanotube web obtained using the carbon nanotube array shown in FIG. 5.

FIG. 5 is a schematic perspective view illustrating a modification of a carbon nanotube array. FIG. 6 is a schematic plan view illustrating an example of a carbon nanotube web obtained using the carbon nanotube array shown in FIG. 5.

The carbon nanotube array 120 shown in FIG. 5 is similar to the carbon nanotube array 120 described referring to FIG. 3, except that a plurality of pores or concavities 120H are provided therein.

For example, the pores or concavities 120H may be through holes. In this case, the carbon nanotube array 120 having the pores or concavities 120H can be obtained, for example, by having the catalyst layer 32 described referring to FIG. 3 opened at positions corresponding to the pores or concavities 120H.

Alternatively, the pores or concavities 120H may be blind pores, i.e., concavities provided at the surface of the carbon nanotube array 120 and having bottoms which are formed of ends of the plurality of carbon nanotubes 1200. In this case, the carbon nanotube array 120 having the pores or concavities 120H can be obtained, for example, by preparing the carbon nanotube array 120 shown in FIG. 4, and forming a mask layer thereon having openings at positions corresponding to the pores or concavities 120H, followed by etching the carbon nanotubes 1200 inward into the array at the positions of the openings.

A carbon nanotube array 120 having pores or concavities 120H is thus obtained through the processes described above. Then, except for using this array, a carbon nanotube web 121 is obtained using a method similar to the method described referring to FIG. 4. Since the carbon nanotube array 120 includes the pores or concavities 120H, the carbon nanotube web 121 obtained in this way includes a plurality of pores 121H as shown in FIG. 6. The pores 121H are preferred to have a maximum diameter of 100 nm or less.

The pores 121H can be formed at any positions and with any dimensions by appropriately setting the positions and dimensions of the pores or concavities 120H provided to the carbon nanotube array 120, the speed of drawing out the carbon nanotube web 121, and other parameters. Accordingly, if the carbon nanotube web 121 including the pores 121H is applied to the pellicle film 12, for example, transmittance of the pellicle film 12 can be enhanced without adversely affecting the patterning performed using the photomask 2.

In the case of using the carbon nanotube web 121 including the pores 121H in the pellicle film 12, with the thickness of the pellicle film 12 increased, transmittance that can be achieved is equivalent to the transmittance in the case of using the carbon nanotube web including the pores 121H. In the case of using the carbon nanotube web 121 including the pores 121H in the pellicle film 12, the thickness of the pellicle film 12 is preferred to be 1,000 nm or less.

A structure including a laminate of a plurality of carbon nanotube webs has been described so far, but the pellicle film 12 may have other structures.

Figure 7:
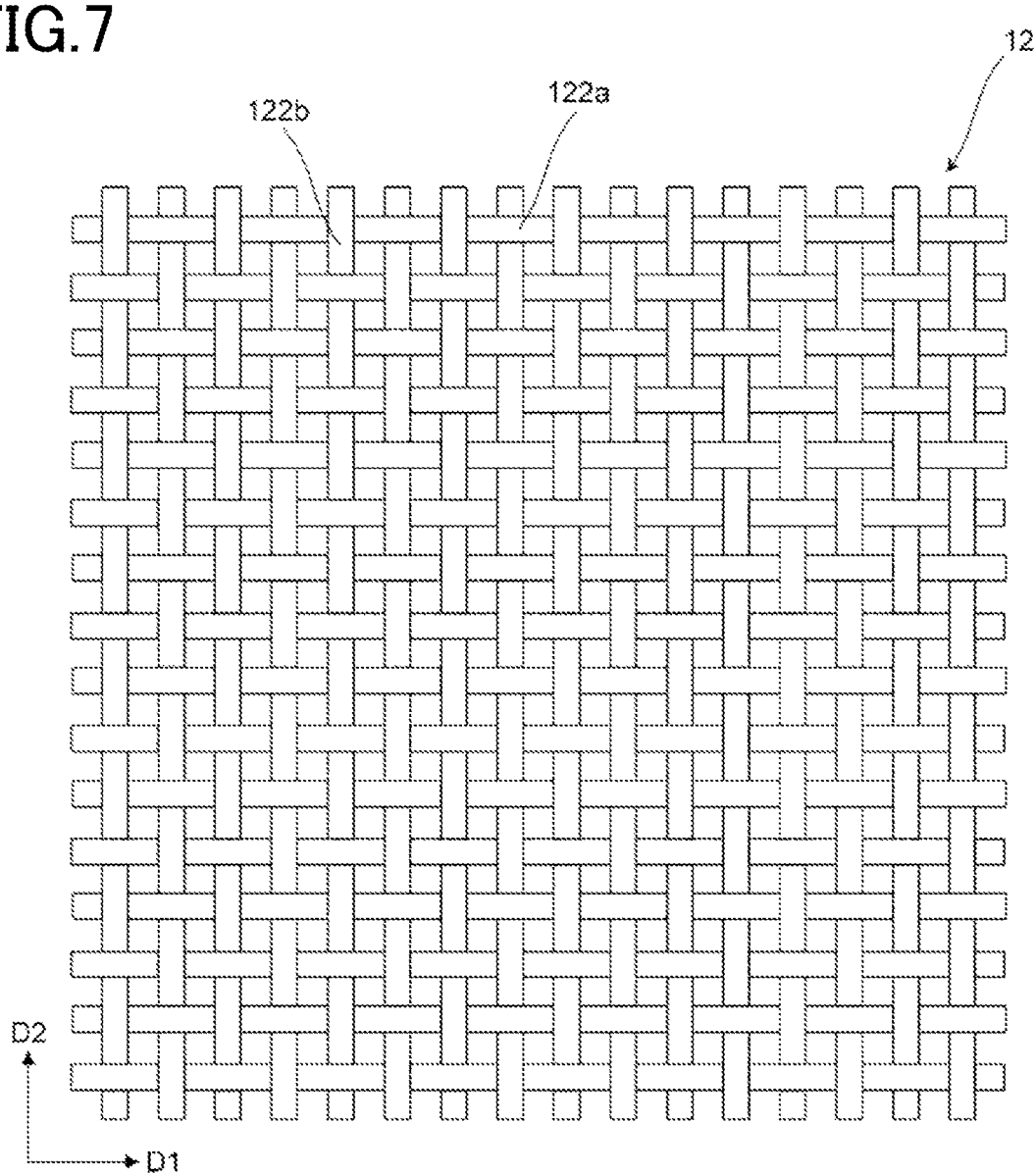
FIG. 7 is a schematic plan view illustrating another example of a pellicle film that can be used for the pellicle shown in FIG. 1.
Figure 8:
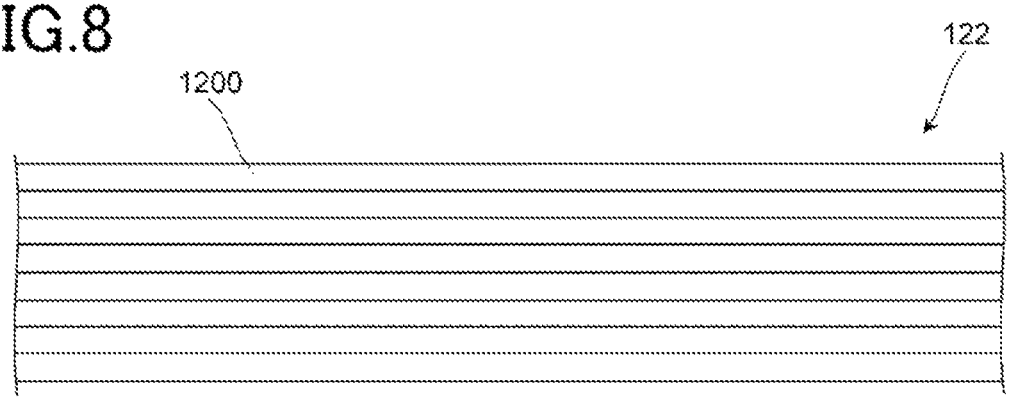
FIG. 8 is a schematic diagram illustrating an example a carbon nanotube thread that can be used for the pellicle film shown in FIG. 7.

FIG. 7 is a schematic plan view illustrating another example of a pellicle film that can be used for the pellicle shown in FIG. 1. FIG. 8 is a schematic diagram illustrating an example a carbon nanotube thread that can be used for the pellicle film shown in FIG. 7.

The pellicle film 12 shown in FIG. 7 contains a plurality of first carbon nanotube threads 122*a* extending in a first direction D1, and a plurality of second carbon nanotube threads 122*b* extending in a second direction D2 intersecting the first direction D1. The first and second carbon nanotube threads 122*a* and 122*b* form a woven textile. The woven textile may have a plain weave, twill weave, or satin weave.

Each thread of the first and second carbon nanotube threads 122*a* and 122*b* has a structure, for example, similar to the carbon nanotube thread 122 shown in FIG. 8. The carbon nanotube thread 122 shown in FIG. 8 includes a plurality of carbon nanotubes 1200 extending in the length direction of the carbon nanotube thread 122.

This pellicle film 12 is preferred to have a thickness of 500 nm or less. If the pellicle film 12 is thicker, transmittance for exposure light, which is EUV light herein, may be deteriorated. The thickness of this pellicle film 12 is preferred to be 10 nm or more. If the pellicle film 12 is thinner, physical strength thereof may be reduced, and dust and other materials may permeate into the pellicle film 12.

Each thread of the first and second carbon nanotube threads 122*a* and 122*b* is preferred to have a diameter of 100 nm or less. If the diameter is larger, the pellicle film 12 may have a larger thickness. Each thread of the first and second carbon nanotube threads 122*a* and 122*b* is preferred to have a diameter of 1 nm or more. If the diameter is smaller, physical strength thereof may be reduced, and productivity of the woven textile may be reduced.

It is preferred that the pellicle film 12 does not allow permeation of dust and other materials with a diameter of more than 30 nm therethrough. In other words, in the first and second carbon nanotube threads 122*a* and 122*b*, the maximum distance between the adjacent threads is preferred to be 100 nm or less. Even if the maximum length between the adjacent threads in the first and second carbon nanotube threads 122*a* and 122*b* is 100 nm, dust and other materials with a diameter of 30 nm could permeate through the threads. However, if a plurality of carbon nanotube layers each having a structure similar to that of the pellicle film 12 described referring to FIG. 7 are overlapped with each other for use as a pellicle film, dust and other materials can be prevented from permeating therethrough.

For example, this pellicle film 12 can be prepared using the following method.

Figure 9:
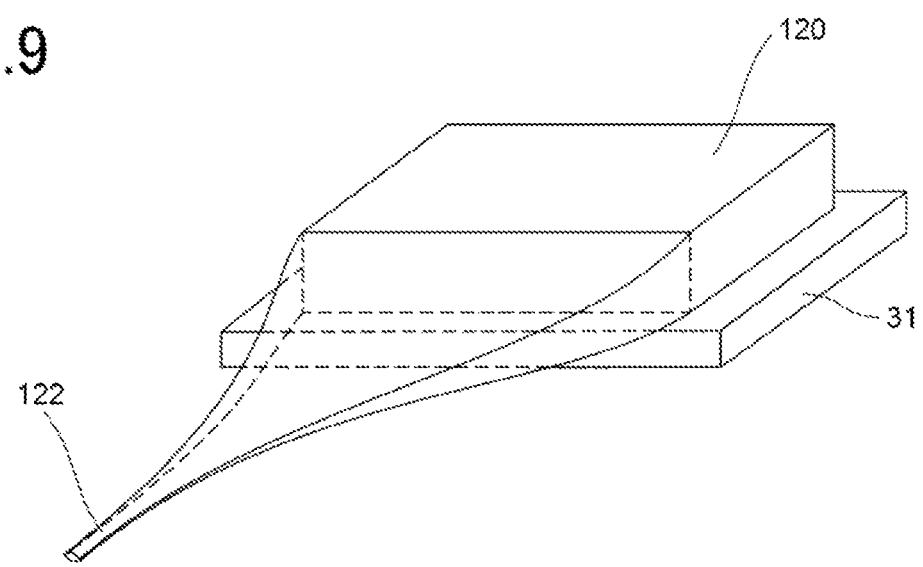
FIG. 9 is a schematic perspective view illustrating an example of a method of producing a carbon nanotube thread.

FIG. 9 is a schematic perspective view illustrating an example of a method of producing a carbon nanotube thread. First, a carbon nanotube array 120 shown in FIG. 9 is prepared using a method similar to the method described referring to FIG. 3.

Next, as shown in FIG. 9, the carbon nanotubes 1200 are drawn out in a thread shape from an end face of the carbon nanotube array 120. The carbon nanotubes 1200 adjacent to each other in the radial direction experience the Van der Waals force. Therefore, for example, when the end face of the carbon nanotube array 120 or a part thereof is held and stretched in a direction away from the carbon nanotube array 120, the carbon nanotubes 1200 can be drawn out from the carbon nanotube array 120 one after another. Thus, a carbon nanotube thread 122 can be obtained without using an adhesive or the like.

It should be noted that the carbon nanotube thread 122 may be twisted, or may not be twisted as shown in FIG. 8. If not twisted, most of the carbon nanotubes 1200 in the carbon nanotube thread 122 will have a shape extending in the direction in which they are drawn out.

After that, a woven textile is formed using the carbon nanotube threads 122. Then, the woven textile is pressed. The woven textile may be pressed in its entirety, or only one or more portions thereof may be pressed. The laminate does not necessarily have to be pressed.

Through the process described above, a carbon nanotube film can be obtained. The carbon nanotube film thus obtained can be used as the pellicle film 12 described above.

In this carbon nanotube web 121, the first and second carbon nanotube threads 122*a* and 122*b* are formed of the carbon nanotubes 1200, and the woven textile is formed of the threads. The diameter of each thread of the first and second carbon nanotube threads 122*a* and 122*b* can be controlled with high accuracy, and placement of the first and second carbon nanotubes 122*a* and 122*b* can also be controlled with high accuracy. Therefore, the carbon nanotubes 1200 and the intersections thereof can be uniformly distributed. Accordingly, this pellicle film 12 also has high in-plane transmittance uniformity.

This pellicle film 12 can be modified in various ways.

Figure 10:
FIG. 10 is a schematic diagram illustrating a carbon nanotube thread according to a modification.

FIG. 10 is a schematic diagram illustrating a carbon nanotube thread according to a modification.

The carbon nanotube thread 122 described referring to FIG. 8 has a substantially constant diameter in the length direction. In contrast, the carbon nanotube thread 122 shown in FIG. 10 has a diameter varying along the length direction. Except for this, the carbon nanotube thread 122 shown in FIG. 10 is similar to the carbon nanotube thread 122 described referring to FIG. 8. This carbon nanotube 122 can be prepared, for example, using a method similar to the method described referring to FIG. 9, except that the carbon nanotube array 120 described referring to FIG. 5 is used.

The maximum and minimum diameters of the carbon nanotube thread 122, the pitch thereof, and the like can be controlled by appropriately setting the positions and dimensions of the pores or concavities 120H, the speed of drawing out the carbon nanotube web 121, and other parameters. Furthermore, the positions of large-diameter portions or small-diameter portions of the carbon nanotube thread 122 in the woven textile can also be controlled with high accuracy. Accordingly, if the carbon nanotube thread 122 is used for the pellicle film 12, for example, transmittance of the pellicle film 12 and in-plane transmittance uniformity can be controlled.

The pellicle film 12 may further contain carbon nanotubes, carbon nanotube threads, carbon nanotube webs, woven textiles formed of carbon nanotube threads, and a covering layer made of two or more of these materials. Provision of a covering layer can contribute to further reducing permeation of dust and other materials.

For example, the pellicle film 12 described referring to FIG. 2 may further include one or more covering layers covering at least one of the first and second carbon nanotube webs 121a and 121b. In this case, for example, the covering layers may be provided to at least one of first and second carbon nanotube webs 121a and 121b before these webs are overlapped with each other. The covering layers may be provided to at least one of first and second carbon nanotube webs 121a and 121b, after these webs are overlapped with each other. In particular, as described referring to FIG. 6, if the carbon nanotube web 121 including the pores 121H is used for the pellicle film 12, provision of the covering layers can easily maintain a balance between achieving high transmittance and reducing permeation of dust and other materials.

Alternatively, the pellicle film 12 described referring to FIG. 4 may further include one or more covering layers covering at least either of the first carbon nanotube threads 122a and the second carbon nanotube threads 122b, and may further include one or more covering layers covering the woven textile formed of the first and second carbon nanotube threads 122a and 122b. In the former case, for example, the covering layers may be provided to at least either of the first carbon nanotube threads 122a and the second carbon nanotube threads 122b before forming the woven textile. In both of the cases, achieving high transmittance can be easily balanced with reducing permeation of dust and other materials.

For example, the covering layer may be made of metal or semiconductor. According to an example, the covering layer may contain one or more elements selected from the group consisting of silicon, molybdenum, ruthenium, boron, nitrogen, germanium, and hafnium. According to another example, the covering layer may contain boron, boron carbide, zirconium nitride, molybdenum, ruthenium, silicon carbide, titanium nitride, amorphous carbon, graphene, or a combination of two or more thereof.

It should be noted that the carbon nanotube webs, the carbon nanotube threads, and the carbon nanotube films may be used in applications other than pellicles.

REFERENCE SIGNS LIST

1 . . . Pellicle; 2 . . . Photomask; 11 . . . Frame; 12 . . . Pellicle film; 21 . . . Substrate; 22 . . . Multilayer reflective film; 22a . . . Reflective layer; 22b . . . Reflective layer; 23 . . . Capping film; 24 . . . Absorption layer; 31 . . . Substrate; 32 . . . Catalyst layer; 120 . . . Carbon nanotube array; 120H . . . Pore or concavity; 121 . . . Carbon nanotube web; 121a . . . First carbon nanotube web; 121b . . . Second carbon nanotube web; 121H . . . Pore; 122 . . . Carbon nanotube thread; 122a . . . First carbon nanotube thread; 122b . . . Second carbon nanotube thread; 1200 . . . Carbon nanotube; 1200a . . . First carbon nanotube; 1200b . . . Second carbon nanotube; D1 . . . First direction; D2 . . . Second direction.

What is claimed is:

1. A pellicle film, comprising:
   a first linear array formed by a plurality of first parallel, non-overlapping carbon nanotubes each having a respective length extending in a first direction, the first linear array extends in a radial direction of the first parallel, non-overlapping carbon nanotubes, the radial direction of the first parallel, non-overlapping carbon nanotubes is perpendicular to the first direction; and
   a second linear array formed by a plurality of second parallel, non-overlapping carbon nanotubes each having a respective length extending in a second direction intersecting the first direction, the second linear array extends in a radial direction of the second parallel, non-overlapping carbon nanotubes, the radial direction of the second parallel, non-overlapping carbon nanotubes is perpendicular to the second direction.

2. The pellicle film of claim 1, wherein the plurality of first parallel, non-overlapping carbon nanotubes form a first carbon nanotube web, and the plurality of second parallel, non-overlapping carbon nanotubes form a second carbon nanotube web overlapped with the first carbon nanotube web.

3. The pellicle film of claim 2, wherein at least one of the first carbon nanotube web and the second carbon nanotube web is provided with a plurality of pores.

4. The pellicle film of claim 3, further comprising one or more covering layers covering at least one of the first carbon nanotube web and the second carbon nanotube web, the at least one of the first carbon nanotube web and the second carbon nanotube web being provided with the plurality of pores.

5. The pellicle film of claim 3, wherein the plurality of pores have a maximum diameter of 100 nm or less.

6. The pellicle film of claim 1, wherein the plurality of first parallel, non-overlapping carbon nanotubes form a plurality of first parallel, non-overlapping carbon nanotube threads each being formed of a plurality of carbon nanotubes, the plurality of second parallel, non-overlapping carbon nanotubes form a plurality of second parallel, non-overlapping carbon nanotube threads each being formed of a plurality of carbon nanotubes, and the plurality of first parallel, non-overlapping carbon nanotube threads and the plurality of second parallel, non-overlapping carbon nanotube threads form a woven textile.

7. The pellicle film of claim 6, wherein a maximum distance among distances between adjacent carbon nanotube threads in the plurality of first parallel, non-overlapping carbon nanotube threads, and among distances between adjacent carbon nanotube threads in the plurality of second parallel, non-overlapping carbon nanotube threads is 100 nm or less.

8. The pellicle film of claim 6, wherein one or more carbon nanotube threads, in the plurality of first parallel, non-overlapping carbon nanotube threads and the plurality of second parallel, non-overlapping carbon nanotube threads, each have a diameter varying along a length direction.

9. The pellicle film of claim 1, wherein the pellicle film has a thickness of 500 nm or less.

10. A pellicle, comprising:
the pellicle film of claim 1; and
a frame supporting the pellicle film.

11. A pellicle film, comprising:
a plurality of first parallel, non-overlapping carbon nanotube threads each being formed of a plurality of first parallel, non-overlapping carbon nanotubes each having a respective length extending in a first direction; and
a plurality of second parallel, non-overlapping carbon nanotube threads each being formed of a plurality of second parallel, non-overlapping carbon nanotubes each having a respective length extending in a second direction intersecting the first direction, wherein
the plurality of first parallel, non-overlapping carbon nanotube threads and the plurality of second parallel, non-overlapping carbon nanotube threads form a woven textile.

12. A carbon nanotube web comprising a linear array formed by a plurality of parallel, non-overlapping carbon nanotubes each having a respective length extending in a first direction, the linear array extends in a radial direction of the carbon nanotubes, the radial direction of the carbon nanotubes is perpendicular to the first direction, wherein the carbon nanotube web is provided with a plurality of pores.

13. A carbon nanotube film, comprising:
a first carbon nanotube web including a plurality of first parallel, non-overlapping carbon nanotubes each extending in a first direction, the first carbon nanotube of said plurality extend in a radial direction of the first carbon nanotubes, the radial direction of the first carbon nanotubes is perpendicular to the first direction; and
a second carbon nanotube web including a plurality of second parallel, non-overlapping carbon nanotubes each extending in a second direction intersecting the first direction, the second carbon nanotubes of said plurality form a linear array extending in a radial direction of the second carbon nanotubes, the radial direction of the second carbon nanotubes is perpendicular to the second direction, wherein
at least one of the first carbon nanotube web and the second carbon nanotube web is provided with a plurality of pores.

14. A carbon nanotube thread comprising a plurality of parallel, non-overlapping carbon nanotubes, wherein the carbon nanotube thread has a diameter varying along a length direction.

15. A method of producing a carbon nanotube web, comprising:
preparing a linear carbon nanotube array formed of a plurality of parallel, non-overlapping carbon nanotubes extending from a support surface, the linear carbon nanotube array including one or more pores or concavities; and
drawing out the carbon nanotubes in a web shape from an end face of the carbon nanotube array.

16. A method of producing a carbon nanotube thread, comprising:
preparing a linear carbon nanotube array formed of a plurality of parallel, non-overlapping carbon nanotubes extending from a support surface, the carbon nanotube array including one or more pores or concavities; and
drawing out the carbon nanotubes in a thread shape from an end face of the carbon nanotube array.

* * * * *